(12) United States Patent
Farley et al.

(10) Patent No.: US 9,978,599 B2
(45) Date of Patent: May 22, 2018

(54) WAFER COOLING APPARATUS AND METHOD

(71) Applicant: Axcelis Technologies, Inc., Beverly, MA (US)

(72) Inventors: Marvin Farley, Ipswich, MA (US); Mike Ameen, Newburyport, MA (US); Causon Ko-Chuan Jen, San Jose, CA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days. days.

(21) Appl. No.: 15/609,273

(22) Filed: May 31, 2017

(65) Prior Publication Data

US 2017/0352544 A1    Dec. 7, 2017

Related U.S. Application Data

(60) Provisional application No. 62/344,483, filed on Jun. 2, 2016.

(51) Int. Cl.
*H01L 21/265* (2006.01)
*H01L 21/67* (2006.01)
(Continued)

(52) U.S. Cl.
CPC ........ *H01L 21/26513* (2013.01); *C23C 14/48* (2013.01); *C23C 14/541* (2013.01);
(Continued)

(58) Field of Classification Search
CPC ............ H01L 21/324; H01L 21/67201; H01L 21/67213
See application file for complete search history.

(56) References Cited

U.S. PATENT DOCUMENTS

2005/0008983 A1    1/2005    Wang
2013/0320208 A1    12/2013    Lee
(Continued)

FOREIGN PATENT DOCUMENTS

WO    2011/155987 A1    12/2011

OTHER PUBLICATIONS

International Search Report and Written Opinion dated Sep. 11, 2017 in connection with International Application No. PCT/US2017/034979.

*Primary Examiner* — Quoc Hoang
(74) *Attorney, Agent, or Firm* — Eschweiler & Potashnik, LLC (57) ABSTRACT

An ion implantation system has a first chamber and a process chamber with a heated chuck. A controller transfers the workpiece between the heated chuck and first chamber and selectively energizes the heated chuck first and second modes. In the first and second modes, the heated chuck is heated to a first and second temperature, respectively. The first temperature is predetermined. The second temperature is variable, whereby the controller determines the second temperature based on a thermal budget, an implant energy, and/or an initial temperature of the workpiece in the first chamber, and generally maintains the second temperature in the second mode. Transferring the workpiece from the heated chuck to the first chamber removes implant energy from the process chamber in the second mode. Heat may be further transferred from the heated chuck to a cooling platen by a transfer of the workpiece therebetween to sequentially cool the heated chuck.

19 Claims, 4 Drawing Sheets

(51) Int. Cl.
*H01L 21/677* (2006.01)
*H01J 37/317* (2006.01)
*H01J 37/20* (2006.01)
*C23C 14/48* (2006.01)
*C23C 14/54* (2006.01)

(52) U.S. Cl.
CPC .......... *H01J 37/20* (2013.01); *H01J 37/3171* (2013.01); *H01L 21/67103* (2013.01); *H01L 21/67115* (2013.01); *H01L 21/67742* (2013.01); *H01J 2237/2001* (2013.01)

(56) References Cited

U.S. PATENT DOCUMENTS

| | | |
|---|---|---|
| 2014/0034846 A1 | 2/2014 | Lee |
| 2015/0228514 A1 | 8/2015 | Lee |
| 2016/0149733 A1* | 5/2016 | Criminale ........... H04L 25/4902 375/238 |

* cited by examiner

WAFER COOLING APPARATUS AND METHOD

REFERENCE TO RELATED APPLICATIONS

This application claims the benefit of U.S. Provisional Application No. 62/344,483 filed Jun. 2, 2016, entitled "WAFER COOLING METHOD", the contents of which are herein incorporated by reference in their entirety.

FIELD OF THE INVENTION

The present invention relates generally to workpiece processing systems and methods for processing workpieces, and more specifically to a system and method for uniformly controlling a temperature of a workpiece on a heated chuck during ion implantation.

BACKGROUND OF THE INVENTION

In semiconductor processing, many operations, such as ion implantation, may be performed on a workpiece or semiconductor wafer. As ion implantation processing technology advances, a variety of ion implantation temperatures at the workpiece can be implemented to achieve various implantation characteristics in the workpiece. For example, in conventional ion implantation processing, three temperature regimes are typically considered: cold implants, where process temperatures at the workpiece are maintained at temperatures below room temperature, hot implants, where process temperatures at the workpiece are maintained at high temperatures typically ranging from 300-600° C., and so-called quasi-room temperature implants, where process temperatures at the workpiece are maintained at temperatures slightly elevated above room temperature, but lower than those used in high temperature implants, with quasi-room temperature implant temperatures typically ranging from 50-100° C.

Hot implants, for example, are becoming more common, whereby the process temperature is typically achieved via a dedicated high temperature electrostatic chuck (ESC), also called a heated chuck. The heated chuck holds or clamps the workpiece to a surface thereof during implantation. A conventional high temperature ESC, for example, comprises a set of heaters embedded under the clamping surface for heating the ESC and workpiece to the process temperature (e.g., 300° C.-600° C.), whereby a gas interface conventionally provides a thermal interface from the clamping surface to the backside of the workpiece. Typically, a high temperature ESC is cooled through radiation of energy to the chamber surfaces in the background.

Chilled ion implantation processes are also common, where conventionally, a room temperature workpiece is placed on a chilled chuck, and the chilled chuck is cooled to a chilled temperature (e.g., a temperature below room temperature), thereby cooling the workpiece. Cooling the chilled chuck provides for a removal of thermal energy imparted into the workpiece from the ion implantation, while further maintaining the chuck and workpiece at the chilled temperature during the implant via the removal of heat through the chilled chuck.

Ion implantation processes are also performed at so-called "quasi-room temperature" (e.g., a temperature slightly elevated above room temperature, such as at 50-60° C., but not as high as a hot ion implantation process), whereby a low-heat chuck (e.g., a chuck configured to heat to a temperature less than 100° C.) has been conventionally used to control the temperature of the workpiece during implantation. However, in the use of such low-heat chucks, a relatively cold (e.g., room temperature, approximately 20° C.) workpiece is placed onto the low-heat chuck, whereby a backside gas thermally couples low-heat chuck and workpiece, thereby transferring energy from the low-heat chuck into the workpiece until an equilibrium temperature is reached prior to conducting the ion implantation.

Such a heating of the workpiece by a low-heat chuck, however, can lead to variations in implant temperature from workpiece to workpiece, as energy is not only transferred from the low-heat chuck to the workpiece prior to implant, but heat is also generated from the implant, itself, whereby the temperature of the low-heat chuck can fluctuate over a period of time. Such fluctuations can have deleterious effects on homogeneity of implants from workpiece to workpiece, and the variations can be exacerbated during startup of the implant system, when a steady-state operation has not yet been reached.

Typically, high temperature ESCs (e.g., heated chucks) are only utilized for hot implants, as they pose a problem if the desired processing is changed from high temperature processing (e.g., 300° C.-600° C.) to a quasi-room temperature processing (e.g., <100° C.) due, at least in part, to the configuration of the heaters therein, and control mechanisms for controlling the temperature of the implant. Thus, when changing from a high temperature implant to a quasi-room temperature implant, the heated chuck would be replaced by a low-heat chuck, whereby the heated chuck and low-heat chuck have differing heat transfer capabilities specifically designed for the desired processing temperature.

SUMMARY OF THE INVENTION

The present invention overcomes the limitations of the prior art by providing a system and method for implanting workpieces on a high temperature electrostatic chuck, whereby the system and method provide a configuration for both high temperature and quasi-room temperature implants.

Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an ion implantation system having an ion implantation apparatus and a method for controlling a heating of a workpiece therein. The ion implantation system, for example, comprises an ion implantation apparatus configured to direct an ion beam toward a process chamber. A first chamber is operably coupled to the process chamber, and a heated chuck is positioned within the process chamber. The heated chuck, for example, is configured to selectively clamp a workpiece to a clamping surface thereof, wherein the heated chuck comprises one or more heaters associated therewith. The one or more heaters, for example, are embedded within the heated chuck and are configured to selectively heat the clamping surface. Alternatively, the one or more heaters comprise one or more radiant heat sources directed toward the clamping surface of the heated chuck. A workpiece transfer apparatus is further configured to transfer the workpiece between the heated chuck and the first chamber.

In accordance with another aspect, a controller is provided and configured to selectively transfer the workpiece between the heated chuck and the first chamber via the workpiece transfer apparatus. The controller is further configured to selectively energize the one or more heaters to operate the heated chuck in each of a first mode and a second mode. In the first mode, the one or more heaters heat the clamping surface to a first temperature associated with a high temperature ion implantation. In the second mode, the one or more heaters heat the clamping surface to a second temperature associated with a quasi-room temperature ion implantation.

The controller, for example, is configured to determine the second temperature based on one or more of a thermal budget associated with the workpiece, an implant energy associated with the ion beam impacting the workpiece, and an initial temperature of the workpiece when the workpiece resides in the first chamber. The controller is further configured to generally maintain the second temperature on the heated chuck in the second mode, wherein transferring the workpiece from the heated chuck to the first chamber generally removes the implant energy from the process chamber when the heated chuck is operated in the second mode.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed generally toward ion implantation systems, and more particularly, to an ion implantation system configured for both hot and quasi-room temperature implants. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Figure 1:
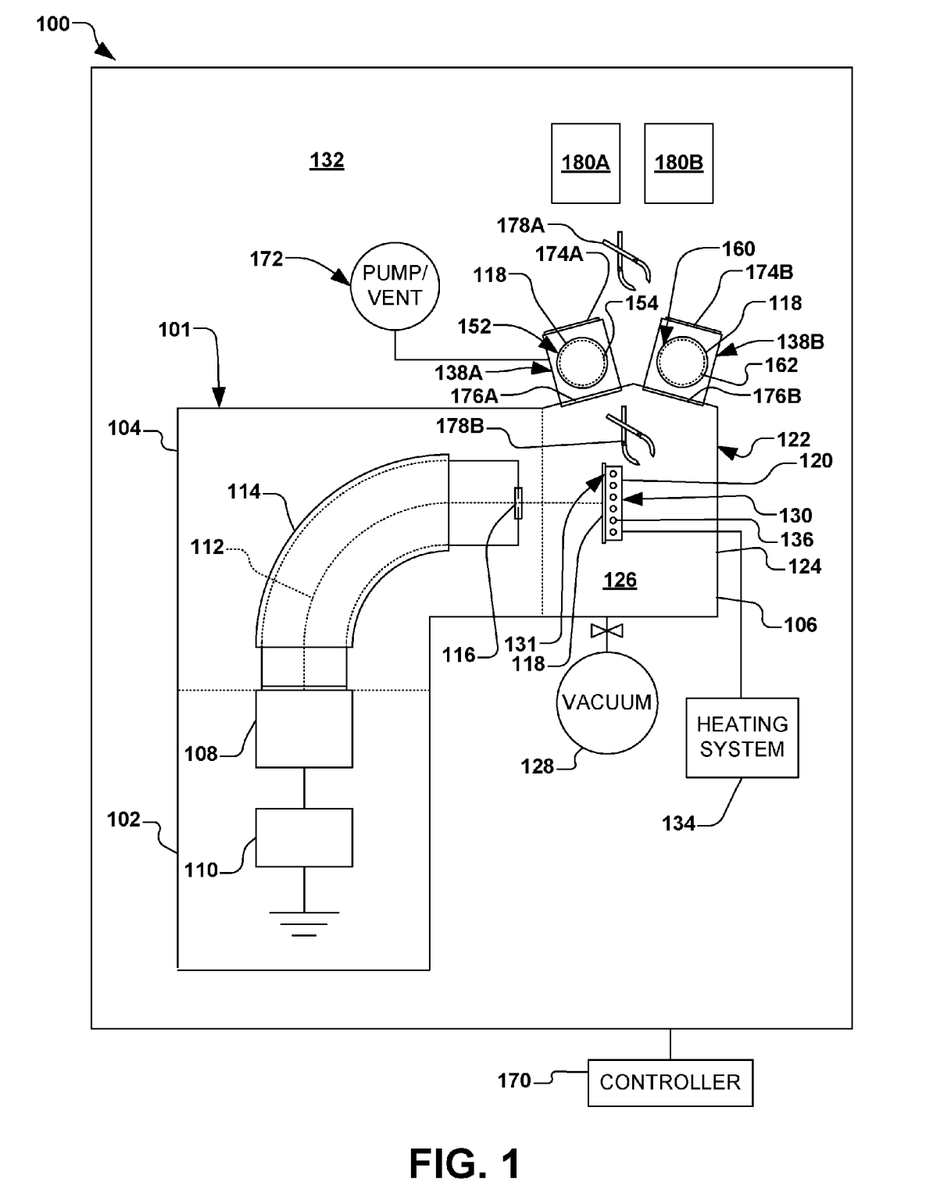
FIG. 1 illustrates a block diagram of an exemplary heated ion implantation system in accordance with one aspect of the present disclosure.

In accordance with one aspect of the present disclosure, FIG. 1 illustrates an exemplary ion implantation system 100.

The ion implantation system 100 in the present example comprises an exemplary ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In one example, the ion implantation apparatus 101 is configured to provide a high temperature ion implantation, wherein the workpiece 118 is heated to a process temperature (e.g., approximately 300-600° C.). Thus, in the present example, the chuck 120 comprises a heated chuck 130, wherein the heated chuck is configured to support and retain the workpiece 118 on a clamping surface 131 thereof, while further permitting heating of the workpiece 118 within the process chamber 122 prior to, during, and/or after the exposure of the workpiece to the ion beam 112.

The heated chuck 130, for example, comprises an electrostatic chuck (ESC) configured to support the workpiece 118 while the workpiece is heated to a processing temperature that is considerably greater than an ambient or atmospheric temperature of the surroundings or external environment 132 (e.g., also called an "atmospheric environment"). For example, a heating system 134 may be further provided, wherein the heating system is configured to heat the heated chuck 130 (e.g., the clamping surface 131) and, in turn, the workpiece 118 residing thereon to the desired processing temperature. The heating system 134, for example, is configured to selectively heat the workpiece 118 via one or more heaters 136 disposed within the heated chuck 130. Alternatively, the one or more heaters 136 of the heating system 134 may comprise a radiant heat source (not shown), such as one or more of a halogen lamp, light emitting diode, and infrared thermal device that are external to the heated chuck 130.

For some high temperature implants, the workpiece 118 is allowed to "soak" on the heated chuck 130 within the vacuum of the process environment 126 until the desired temperature is reached. Alternatively, in order to increase cycle time through the ion implantation system 100 the workpiece may be pre-heated in one or more chambers 138A, 138B (e.g., one or more load lock chambers) operatively coupled to the process chamber 122 via a pre-heat apparatus 152.

Depending on the tool architecture, process, and desired throughput, the workpiece 118 may be preheated to the first temperature via the pre-heat apparatus 152, wherein the first temperature is equal to or lower than the process temperature, thus allowing for a final thermal equalization on the heated chuck 130 inside the vacuum chamber 124. Such a scenario allows the workpiece 118 to lose some heat during transfer to the process chamber 122, wherein final heating to the process temperature is performed on the heated chuck 130. Alternatively, the workpiece 118 may be preheated via the pre-heat apparatus 152 to a first temperature that is higher than the process temperature. Accordingly, the first temperature would be optimized so that cooling of the workpiece 118 during transfer to the process chamber 122 is just enough for the workpiece to be at the desired process temperature as it is clamped onto the heated chuck 130.

The pre-heat apparatus 152 associated with the one or more chambers (e.g., illustrated in chamber 138A in FIG. 1) can advantageously heat the workpiece 118 at the atmospheric pressure of the external environment 132 prior to bringing the workpiece to the vacuum of the process environment 126 of the process chamber 122. For example, heat transfer into the workpiece 118 in a high vacuum environment, such is within the process chamber 122, is largely dominated by radiation. Total hemispherical emissivity of crystalline silicon in temperatures between 300-500° C., for example, ranges between approximately 0.2 and 0.6, thus not lending itself well to fast thermal transients due to a low rate of irradiated heat absorption of the workpiece 118.

In order to accelerate the thermal ramp-up and enable an additional mechanism for heat transfer, the back side of the workpiece 118 is brought into conductive communication with the heated chuck 130. This conductive communication is achieved through a pressure controlled gas interface (also called "back side gas") between the heated chuck 130 and the workpiece 118. Pressure of the back side gas, for example, is generally limited by the electrostatic force of the heated chuck 130, and can be generally kept in the range of 5-20 Torr. In one example, the back side gas interface thickness (e.g., the distance between the workpiece 118 and the heated chuck 130) is controlled on the order of microns (typically 5-20 μm), and as such, the molecular mean free path in this pressure regime becomes large enough for the interface thickness to push the system into the transitional and molecular gas regime.

Alternatively, the pre-heat apparatus 152 may heat the workpiece 118 at the vacuum pressure of the process environment 126. In yet another alternative, the pre-heat apparatus 152 may heat the workpiece 118 during the same timeframe that the one or more chambers 138A, 138B are being pumped down to transition from atmospheric pressure to vacuum pressure.

The pre-heat apparatus 152, for example, comprises a hot plate 154 positioned within the chamber 138A. The hot plate 154, for example, comprises a resistive heater, which could include a heating element embedded in the hot plate, a heat pump, or other heating mechanism for transmitting heat energy form the hot plate to the workpiece 118. Alternatively, the pre-heat apparatus 152 comprises a radiant heat source, such as one or more of a halogen lamp, light emitting diode, and infrared thermal device.

In accordance with another aspect of the disclosure, chamber 138B comprises a cooling apparatus 160 configured to cool the workpiece when the workpiece 118 is disposed within the chamber 138B subsequent to being implanted with ions during ion implantation. The cooling apparatus 160, for example, may comprise a chilled workpiece support 162, wherein the chilled workpiece support is configured to actively cool the workpiece 118 residing thereon via thermal conduction. The chilled workpiece support 162, for example, comprises a cold plate having a one or more cooling channels passing therethrough, wherein a cooling fluid passing through the cooling channel substantially cools the workpiece 118 residing on a surface of the cold plate. The chilled workpiece support 162 may comprise other cooling mechanisms, such as Peltier coolers or other cooling mechanisms known to one of ordinary skill.

In accordance with another exemplary aspect, a controller 170 is further provided and configured to selectively activate the heating system 134, the pre-heat apparatus 152, and the cooling apparatus to selectively heat or cool the workpiece 118 respectively residing thereon. The controller 170, for example, may be configured to heat the workpiece 118 in chamber 138A via the pre-heat apparatus 152, to heat the workpiece to a predetermined temperature in the processing chamber 122 via the heated chuck 130 and heating system 134, to implant ions into the workpiece via the ion implantation apparatus 101, to cool the workpiece in chamber 138B via the cooling apparatus 160, and to selectively transfer the workpiece between the external environment 132 (e.g., atmosphere) and the process environment 126 (e.g., a vacuum environment) via control of a pump and vent 172, the respective atmospheric doors 174A, 174B and vacuum doors 176A, 176B of the respective chambers 138A, 138B, and workpiece transfer apparatus 178A, 178B.

In one example, the workpiece 118 may be further delivered to and from the process chamber 122 such that the workpiece is transferred between a selected front opening unified pod (FOUP) 180A, 180B and chambers 138A, 138B via workpiece transfer apparatus 178A, and further transferred between the chambers 138A, 138B and the heated chuck 130 via workpiece transfer apparatus 178B. The controller 170, for example, is further configured to selectively transfer the workpiece between the FOUPs 180A, 180B, chambers 138A, 138B, and heated chuck 130 via a control of the workpiece transfer apparatus 178A, 178B.

As stated previously, conventional ion implantation systems typically utilize various electrostatic chucks having differing configurations, whereby implants performed at different temperature ranges utilize respectively different electrostatic chucks having differing heat transfer capabilities. The system 100 of FIG. 1 of the present disclosure, however, is advantageously configured to perform both high temperature implants (e.g., in the range of 300-600° C.) and quasi-room temperature implants (e.g., in the range of 20-100° C.) while utilizing the same heated chuck 130. Such a configuration is advantageous over conventional systems in both simplicity, as well as productivity, as the system 100 of FIG. 1 may be utilized in various implantation schemes with minimal changes in configuration while mitigating various deficiencies commonly seen in conventional startup operations of conventional ion implantation systems.

In accordance with the present disclosure, the thermal mass of the heated chuck 130, for example, advantageously acts as an absorber of energy to store implant energy during ion implantation, where said stored implant energy may be removed from the ion implantation apparatus 101 upon removal of the workpiece 118 therefrom. Accordingly, the present disclosure advantageously manages the thermal energy concurrent with ion implantation in an innovative way.

For example, the heated chuck 130 comprises clamping plate approximately 300 mm in diameter, the thermal mass of the clamping plate is roughly 3372 joules/K. The workpiece 118 (e.g., a silicon wafer), having a diameter of 300 mm, on the other hand, has a thermal mass is 80.7 Joules/K. Thus, as will be understood upon viewing the foregoing examples in the present disclosure, the thermal mass of the heated chuck 130 may act as an absorber of energy to store implant energy during ion implantation, whereby the stored implant energy may be removed from the ion implantation apparatus 101 upon removal of the workpiece 118 therefrom.

In a general example, the workpiece 118 is loaded onto the heated chuck 130 at a temperature of about 20° C. (e.g., approximately room temperature). If the temperature of the workpiece 118 is allowed to rise while on the heated chuck 130 and its stored energy is equivalent to the implant energy at the end of the ion implantation, then, on average, the temperature of the heated chuck will be constant and the workpiece will take out as much energy from the ion implantation system as is deposited during ion implantation when the workpiece is removed from the system 100.

The present disclosure advantageously manages such an energy equilibrium associated with the heated chuck 130. For example, a maximum thermal budget $T_{budget}$ (e.g., a predetermined maximum temperature of the surface of the workpiece during processing) is provided (e.g., $T_{budget}$=100° C.), and an initial temperature $T_0$ of the workpiece is provided at 20° C. Thus, in the present example, a temperature differential $T_{diff}$ (e.g., $T_{budget}-T_0$) of 80° C. is available for other variables, such as energy stored in the workpiece 118 and heat flow through the thermal resistance between workpiece and heated chuck 130. The present disclosure advantageously constrains the change in energy of the workpiece 118 at the end of the implant to be approximately equal to the implant energy deposited during the implant. This is accomplished, for example, by preheating the heated chuck 130 to a temperature approximately equal to a final predetermined temperature of the workpiece 118. In this way, the average temperature of the heated chuck 130 will be generally constant and the change in temperature of the workpiece 118 will further remain generally constant for subsequent implant steps.

In order to gain a better understanding, the total thermal budget $T_{budget}$ (e.g., the maximum surface temperature of the workpiece) may be defined as:

$$T_{budget}=T_0+Pd/k_g+\{[EDe]/[\rho t C_P]\}/n \quad (1),$$

where $T_0$ is the initial temperature of the workpiece 118, Pd is the power density of the ion beam 112 (e.g., a calculated parameter associated with the thermal budget $T_{budget}$), $k_g$ is the thermal conductivity from the surface of the workpiece through the gas interface to the chuck 130 (e.g., $k_g$=0.083 w/cm²/° C. at 5 torr backside gas pressure using $N_2$ gas), E is the implant energy (e.g., expressed in electron volts), D is the dose of the implant (e.g., expressed in ions/cm²), e is the electron charge (e.g., e=1.602×10$^{-19}$ coulombs), $\rho$ is the density of the workpiece (e.g., $\rho$=2.33 g/cm³ for a conventional silicon wafer), t is the thickness of the workpiece (e.g., t=0.07 cm for a conventional silicon wafer), and $C_P$ is the specific heat capacity of the workpiece at constant pressure (e.g., $C_P$=0.7 J/gm/° K for a conventional silicon wafer). A number of implant steps n represents the number of times a particular workpiece 118 is processed in order to achieve the desired dosage of ions on the workpiece.

An example ion implantation into a workpiece 118 (e.g., a conventional silicon wafer), will now be discussed, where an energy E=40,000 eV, a dose D=1×10$^{15}$ ions/cm², and $\rho t C_P$=0.114 J/cm2/° K are known. An overall change in temperature ($\Delta T_{max}$) of the workpiece 118 for a complete implantation of the workpiece is given as the Dose Energy Product (EDe) divided by the specific heat as $$\Delta T_{max}=[EDe]/[\rho t C_P] \quad (2),$$

where, according to the present example, $\Delta T_{max}$=56.2° C.

In order to determine the number of implant steps n that should be taken to adequately implant the workpiece 118 without exceeding process boundaries, a predetermined budgetary value $T_{recipe}$ is provided based on a process recipe for the implantation. The predetermined budgetary value $T_{recipe}$, for example, is based on various factors associated with the particular ion implantation system 100, such as maximum allowable beam current, expected energy losses, safety factors, and other factors. In the present example, the predetermined budgetary value $T_{recipe}$=30° C., but it is noted that the predetermined budgetary value can vary based on the above-mentioned factors. The number of implant steps n is thus determined by dividing the overall change in temperature $\Delta T_{max}$ by the predetermined budgetary value $T_{recipe}$, and the result of which is rounded up to the nearest integer. In the above example, the number of implant steps n=2, since 56.2/30=1.873.

Accordingly, a predetermined temperature differential $\{T_{budget}-(\Delta T_w+T_0)\}$ remains to account for the temperature rise from the workpiece 118 to the heated chuck 130 for each implant step, where $\Delta T_w$ is the rise in temperature of the workpiece for each implant step. With an exemplary thermal budget $T_{budget}$=100° C. and initial workpiece temperature $T_0$=20° C. from the above example, the predetermined temperature differential $\{T_{budget}-(\Delta T_w+T_0)\}$ equal to 23.8° C. remains in the thermal budget. A preheat temperature $T_{preheat}$ to which the heated chuck 130 should be heated prior to implant may then be determined, where $$T_{preheat}=\Delta T_w+T_0 \quad (3).$$

Using the figures from the example above, the preheat temperature $T_{preheat}$ to which the heated chuck 130 should be heated prior to starting the implant sequence is 76.2° C.

The budget of the beam power density Pd will be $$Pd=kg\{T_{max}-(\Delta T_w+T_0)\} \quad (4),$$

which equals 1.97 watts/cm².

In an exemplary ion implantation utilizing the exemplary ion implantation system 100 (e.g., a Purion M or Purion H ion implantation system manufactured by Axcelis Technologies of Beverly, Mass.), a silicon workpiece 118 having a diameter of 300 mm is exposed to an ion beam 112 having a diameter of 100 mm (e.g., an area of 78.5 cm²) and having a maximum power of 155 watts and a beam current limit of 3.86 mA. The implant area in the present example is 1720 cm², thus resulting in an implant time of 72.5 seconds in the example provided above. Thus, the throughput for such an exemplary implant process will be 46.4 workpieces per hour. Accordingly, with the desired final temperature of the workpiece 118 in the present example being $T_{budget}$=100° C., in order to maintain the temperature of the heated chuck 130 in equilibrium for each subsequent implant, the present disclosure provides for preheating the heated chuck to an initial preheat temperature of $T_{preheat}$=76.2° C. prior to starting the implant.

Accordingly, present disclosure allows the workpiece 118 to remove the energy associated with the implant as the workpiece is removed from the ion implantation system 100. It is noted that in the present example, a small fraction of the total implant energy is removed with the workpiece 118, as the majority of the energy is put into the workpiece 118 when the workpiece is placed on the heated chuck 130 and the workpiece is heated. As the implantation proceeds, the average temperature of the workpiece 118 and heated chuck 130 will rise a small amount, but when the workpiece is removed from the ion implantation apparatus 101, the energy associated with the implant is advantageously removed, also, in accordance with the present disclosure.

As described above, if the calculated workpiece temperature rise $\Delta T_w$ is determined to be too high, for example, then the implant may proceed in multiple steps n, whereby each step maintains the workpiece temperature rise within a predetermined operating range. Thus, the total implant energy divided by the number of steps n is taken out during each implant step, whereby the workpiece is cooled back to $T_0$ (e.g., 20° C.) after each implant step. In another example, the initial workpiece temperature $T_0$ may also be lowered through a pre-cool station inside chamber 138B, whereby the thermal budget may be effectively increased.

The present disclosure thus provides a system and method for maintaining a temperature of the heated chuck 130, taking into account implant energy that is added to the workpiece 118 concurrent with ion implantation. Thus, the present disclosure provides a more versatile electrostatic chuck system and method than conventional electrostatic chuck systems and methods, whereby the presently disclosed heated chuck is configured to perform heated implants as well as so-called "room temperature" implants (e.g., temperatures below 100° C.).

In accordance with an exemplary aspect of the disclosure, the workpiece 118 is loaded onto the heated chuck 130 for a so-called "quasi-room temperature" implant (e.g., an ion implantation with the workpiece temperature ranging from 60-100° C.). A predetermined amount of energy is introduced into the workpiece 118 via the implant, whereby said predetermined amount of energy is advantageously removed from the apparatus 101 when the workpiece is removed from the system. In other words, the energy associated with the ion implantation into the workpiece 118 is removed from the apparatus 101 without continuously increasing the temperature of the system. Conventionally, workpiece temperatures and chuck temperatures continue to ramp up from implant to subsequent implant, especially during startup of such conventional systems, and such a temperature change from implant to implant is problematic.

The present disclosure thus maintains a relatively uniform temperature of the heated chuck 130 within the ion implantation apparatus 101. A gas interface, for example, provides a thermally conductive interface between the workpiece 118 (e.g., a relatively small mass) and the heated chuck 130 (e.g., a relatively large mass). Accordingly, when the workpiece 118 is loaded onto the heated chuck 130, the workpiece absorbs a small amount of energy from the heated chuck. When the workpiece 118 is implanted with ions from the ion beam 112, a predetermined amount of energy (e.g., a few percent of the total energy in the apparatus 101) is added to the workpiece. However, in accordance with the present disclosure, such a predetermined amount of energy is removed from the apparatus 101 when the workpiece is removed from the system. Accordingly, the workpiece 118, itself, is performing a cooling function for the apparatus 101 by removing the energy imparted by the ion beam 112 from the system. The workpiece 118, for example, may be removed at a relatively high temperature, placed in chamber 138B (and optionally cooled therein), whereby another workpiece may be returned to the apparatus 101 via chamber 138A, thus repeating the cycle.

In accordance with another example of the present disclosure, the Dose Energy Product divided by the thermal mass of the workpiece 118, for example, will maintain the temperature of the workpiece below about a predetermined temperature rise (e.g., approximately 5-10° C.). Thus, when the workpiece 118 is removed from the heated chuck 130 at the end of the implant, the workpiece, itself, will experience the predetermined temperature rise, but the energy associated with the predetermined temperature rise is stored in the workpiece and subsequently removed from the apparatus 101 upon removal of the workpiece from the system. Accordingly, the process can start over with another workpiece 118 being loaded onto the heated chuck 130, whereby the workpiece increases in temperature by the predetermined temperature rise (e.g., again, approximately 5-10° C.) concurrent with the implant, and then removed from the apparatus 101, whereby the energy associated with the predetermined temperature rise is again removed from the system with the additional workpiece.

Accordingly, the present disclosure removes the average implant energy from the ion implantation apparatus 101 with each workpiece 118 processed, thus maintaining a generally constant temperature for subsequent implants. The gas interface between the workpiece 118 and the heated chuck 130 and relatively large thermal mass of the heated chuck advantageously mitigate large instantaneous peaks in power associated with scanning the ion beam 112 across the workpiece, whereby the average power of the implant energy provided to the workpiece is mitigated by maintaining the predetermined temperature of the heated chuck.

In process recipes calling for substantially longer implants (e.g., high dose implants), for example, once the temperature of the workpiece 118 rises to a predetermined maximum, the workpiece may be removed from the heated chuck 130 and placed in chamber 138B, for example, in order to cool by a predetermined amount, and then again placed on the heated chuck 130, whereby the process is repeated. It is noted, however, that when the workpiece 118 is removed from the apparatus 101, the implant energy is again likewise removed from the system, thus not leading to an increase in temperature of the system.

In another example, the thermal interface between the workpiece 118 and heated chuck 130 generally prevents a significant increase in the temperature of the heated chuck, thus generally maintaining a constant temperature of the heated chuck. While the present disclosure attempts to maintain a generally constant temperature of the heated chuck 130, a small temperature variation is considered (e.g., a 0.5° C. rise in temperature of the heated chuck for a 10° C. rise temperature of the workpiece 118). However, the small temperature variation of the heated chuck 130 is accounted for by one or more heaters 136 embedded in the heated chuck, wherein the one or more heaters have a higher power loss than the power that is provided by the ion beam 112.

The present disclosure further contemplates utilizing the system 100 for a so-called "high temperature implant", whereby the heated chuck 130 is heated to a high implant temperature of approximately 300-600° C. In such a high temperature implant, the workpiece 118 may be further pre-heated to approximately the high implant temperature prior to being placed on the heated chuck 130, whereby the preheated workpiece 118 is loaded onto the heated chuck and the high temperature implant is performed. Thus, the present disclosure provides a system and method for utilizing the same heated chuck 130 to perform quasi-room temperature implants, as well as high temperature implants, thus providing versatility not previously seen conventional systems.

The Dose Energy Product represents the stored energy per unit of surface area of the workpiece 118. For example, the dose is defined as the integral of the current of the ion beam 112 over time. The total energy deposited per square centimeter of surface the workpiece 118, for example, can be defined as the dose (e.g., in units of atoms/$cm^2$) multiplied by electron charge, multiplied by the energy by of the ion beam 112. The thermal mass is the thermal mass of said surface to its depth (e.g., the thickness of the workpiece 118). The thickness of the workpiece 118, however, is typically relatively small. For example, a workpiece 118 such as a silicon wafer having a diameter of 300 mm will absorb approximately 90 Joules of energy per ° C. Therefore, the thermal response of a 300 mm silicon wafer is 90 Joules of energy to yield a 1° C. rise. The present disclosure advantageously manages the thermal response of the workpiece 118 and heated chuck 130 such that variations of energy are mitigated.

For example, in order to gain a better understanding of the present disclosure, an example of a conventional implantation will be provided. When a conventional ion implantation system is started, a first wafer is loaded onto a cold or ambient temperature chuck, whereby the wafer is subsequently implanted with ions. Accordingly, the temperature of the wafer will rise with the implantation, and the temperature of the chuck will also rise. After the first wafer is removed and the next wafer is loaded onto the chuck, the temperature of the chuck will typically rise again during the subsequent implant. Conventionally, approximately 30-40 wafers are loaded onto the chuck and implanted before an equilibrium temperature on the chuck is reached. Such a variation in temperatures of the wafer and chuck across a batch of wafers is not desirable.

Thus, in accordance with the present disclosure, the equilibrium temperature is determined and the heated chuck 130 is advantageously preheated to the equilibrium temperature prior to the workpiece 118 being placed thereon. By determining the equilibrium temperature and heating the heated chuck 130 to the equilibrium temperature, heat flow issues are taken out of the apparatus 101, such that control of the temperature of the heated chuck 130 is advantageously optimized. Some heat flow is needed in some instances, however, in order to make the control system stable. The present disclosure, however, advantageously controls the average temperature of the implant from workpiece to workpiece.

The present system and method thus determine the equilibrium temperature prior to commencement of the implant, thereby managing the thermal system while implanting ions into the workpiece 118, where the workpiece is considered a component of the thermal system. The present methodology removes a predetermined amount of energy from the system when the workpiece is removed from the system, where the predetermined amount of energy is equal to the total implant energy deposited in the workpiece.

The methodology of the present disclosure, for example, determines an equilibrium temperature of the heated chuck 130, thereby generally preventing an initial ramp up of temperature of the thermal chuck for an initial batch of workpieces 118. In one example, the workpiece 118 is loaded onto the heated chuck 130 when the workpiece is at the initial temperature $T_0$ (e.g., the workpiece is not preheated). As such, the workpiece 118 will increase in temperature from the initial temperature $T_0$ to the processing temperature when thermal conduction commences between the workpiece and heated chuck 130 via the conductive gas. Thus, some energy is absorbed by the workpiece 118 from the heated chuck 130. When the implant is performed, a predetermined amount of energy is placed back into the workpiece 118 via the ion beam 112, but such a predetermined amount of energy generally remains in the workpiece and is removed from the apparatus 101 when the workpiece is unloaded from the heated chuck and removed from the system. For example, the workpiece 118, having a low thermal mass compared to the heated chuck 130, quickly pulls energy (in the form of heat) from the heated chuck when placed thereon, thus having little effect on the heated chuck.

It is appreciated that most energy from the implant is transferred to the heated chuck 130 via the gas interface prior to the start of the implant. Most of the energy of the implant, for example, is transferred to the workpiece 118 prior to starting the implant by heating the chuck 130 and workpiece. Heat initially flows from the heated chuck 130 to the workpiece 118, and then flows through the workpiece to the heated chuck during the course of the implant, where the heat is transferred back to the heated chuck. During the implant, most of the implant energy flows through the workpiece, though the gas interface, and into the heated chuck 130.

The heated chuck 130, itself, has minimal heat loss to its surroundings, where most of such heat loss is radiant energy along with minimal conductive losses through various mounting fixtures associated with the heated chuck. Thus, the heated chuck 130 can be considered thermally isolated within the ion implantation apparatus 101 with a predetermined thermal loss associated therewith.

The heated chuck 130, for example, is mainly cooled by radiation, and can take several hours to cool down from implant temperatures (e.g., 500° C.) to room temperature via radiation, alone. For example, an initial maximum cool-down rate of 3° C. per minute is conventionally permitted, as faster cooling of the heated chuck 130 may lead to fracturing of the heated chuck. When changing from a high-temperature implant to a quasi-room temperature implant, the heated chuck 130 may be heated as it cools. Once the heated chuck 130 reaches approximately 400° C., thermal loss from radiation drops dramatically, and the heated chuck may be allowed to cool down naturally without additional heating. Such a cool-down process can take a significantly long time.

In accordance with the present disclosure, the cool-down rate may be kept intact by advantageously cycling workpieces 118 (without implanting ions therein) through the heated chuck 130. Accordingly, a significant amount of stored energy that can be removed from the system by cycling "cold" workpieces 118 onto and off the heated chuck in order to cool the heated chuck 130.

Thus, the present disclosure provides a system and method for advantageously controlling the overall thermal process associated with ion implantations. When the workpiece 118 is loaded onto the heated chuck 130, for example, the workpiece will cool the heated chuck by a predetermined amount in order to absorb the amount of energy associated with raising the temperature of the workpiece to the temperature of the heated chuck. When an implant is performed on the workpiece, a predetermined amount of energy is deposited on the workpiece 118 via the ion beam 112. The predetermined amount of energy deposited on the workpiece 118 is enough to raise the temperature of the workpiece by a small amount, but not enough to vary the process. Thus, when the workpiece 118 is removed from the ion implantation apparatus 101, substantially all of the implant energy is also removed from the system via the workpiece. In one example, the energy removed from the ion implantation apparatus 101 by the removal of the workpiece 118 therefrom is approximately equal to the Dose Energy Product divided by the mass of the workpiece. The present disclosure thus advantageously determines the predetermined temperature of the workpiece 118 and heated chuck 130 such that said energy does not accumulate on the heated chuck.

In a high temperature implant (e.g., temperatures from 300-600° C.), on the other hand, the workpiece 118 is cooled by radiation, where the heated chuck 130 actively heats the workpiece during the implant, and control of the temperature of the heated chuck is maintained. In such a high temperature implant, heat flows are much greater due to such radiation, where the workpiece 118 is heated via the heated chuck 130 throughout the implant.

For high temperature implants, thermal energy is generally not transferred to the heated chuck 130 from the workpiece 118; rather, all thermal energy is transferred from the heated chuck to the workpiece. That is, for high temperature implants, energy is considered to be transferred one way. While the thermal transfer may not remain constant for high temperature implants due to energy deposited on the workpiece 118 from the ion beam 112, the thermal potential between the workpiece and the heated chuck 130 can vary, thus varying the heat flow from the heated chuck to the workpiece. However, the direction of energy transfer is from the heated chuck 130 to the workpiece 118 in a high temperature implant, whereas for the quasi-room temperature implant, the direction of energy transfer is bi-directional between the heated chuck and workpiece, while maintaining a net transfer of energy close to zero.

Accordingly, the method of the present disclosure provides a determination of a predetermined implant temperature associated with the heated chuck 130, and heating the heated chuck to the predetermined implant temperature. The workpiece 118 is then transferred onto the heated chuck 130, and the backside gas is activated, whereby the workpiece absorbs a predetermined amount of energy from the heated chuck. The workpiece 118 is then implanted with ions, whereby a predetermined amount of implant energy is transferred back to the heated chuck 130, wherein the predetermined amount of implant energy is approximately equal to the predetermined amount of energy absorbed by the workpiece from the heated chuck, thereby maintaining the temperature of the heated chuck within a predetermined range. Once the implant is complete, the workpiece 118 is removed from the heated chuck 130 and removed from the ion implantation apparatus 101, whereby the workpiece removes any remaining implant energy from the system upon its removal therefrom. Thus, net change of energy associated with the heated chuck 130 is approximately zero, or at least within the limits of any control error associated with heating the heated chuck.

Figure 2:
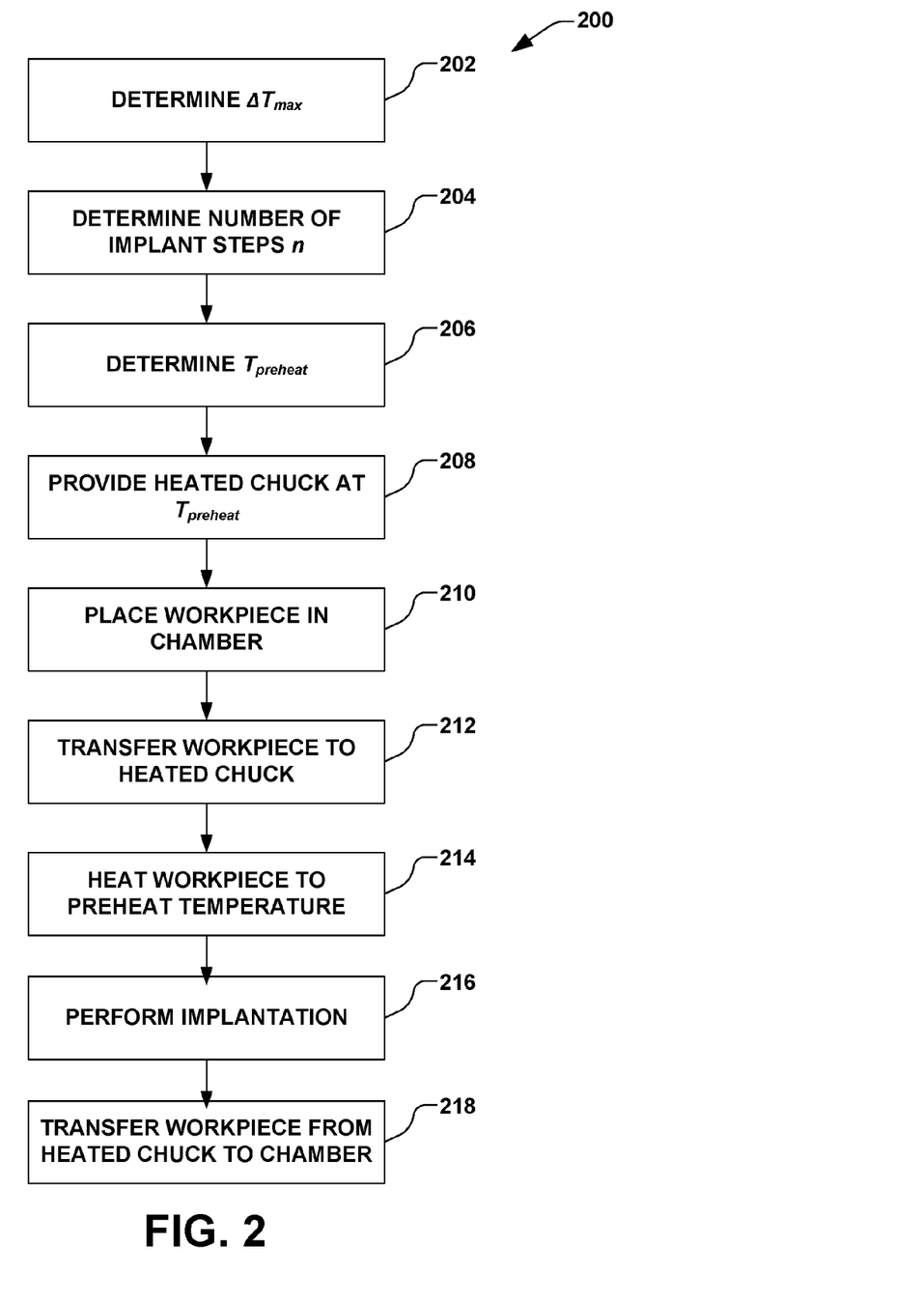
FIG. 2 is a block diagram illustrating an exemplary method for heated ion implantation of workpieces according to another exemplary aspect of the invention.

Accordingly, the present disclosure further provides a method 200 in FIG. 2 for maintaining substantially constant thermal characteristics of a heated chuck for sequential ion implantations. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 2, the method 200 begins at act 202, wherein an overall change in temperature of the workpiece ($\Delta T_{max}$) during implantation is determined based on the Dose Energy Product (EDe) divided by the specific heat of the workpiece for a desired implant temperature. In act 204, a number of implant steps n that should be taken to adequately implant the workpiece is determined based on a predetermined budgetary value $T_{recipe}$ for a process recipe for the implantation. The predetermined budgetary value $T_{recipe}$, for example, is based on various factors associated with the particular ion implantation system, such as maximum allowable beam current, expected energy losses, safety factors, and other factors. The number of implant steps n determined in act 204 is determined by dividing the overall change in temperature $\Delta T_{max}$ by the predetermined budgetary value $T_{recipe}$, and the result of which is rounded up to the nearest integer.

In act 206, a preheat temperature $T_{preheat}$ for heating the heated chuck is determined, and a heated chuck is heated to the preheat temperature $T_{preheat}$ in act 208. In act 210, a workpiece is placed in a first chamber (e.g., a load lock chamber). In act 212, the workpiece is removed from the first chamber and placed on the heated chuck at the preheat temperature $T_{preheat}$. For example, the workpiece is transferred from the first chamber to the heated chuck via a workpiece transfer apparatus. In act 214, the workpiece is heated via the heated chuck. In act 216, the implant steps n of the implantation are performed, and in act 218, the workpiece is removed from the heated chuck, thus removing the implant energy from the system with the workpiece.

Figure 3:
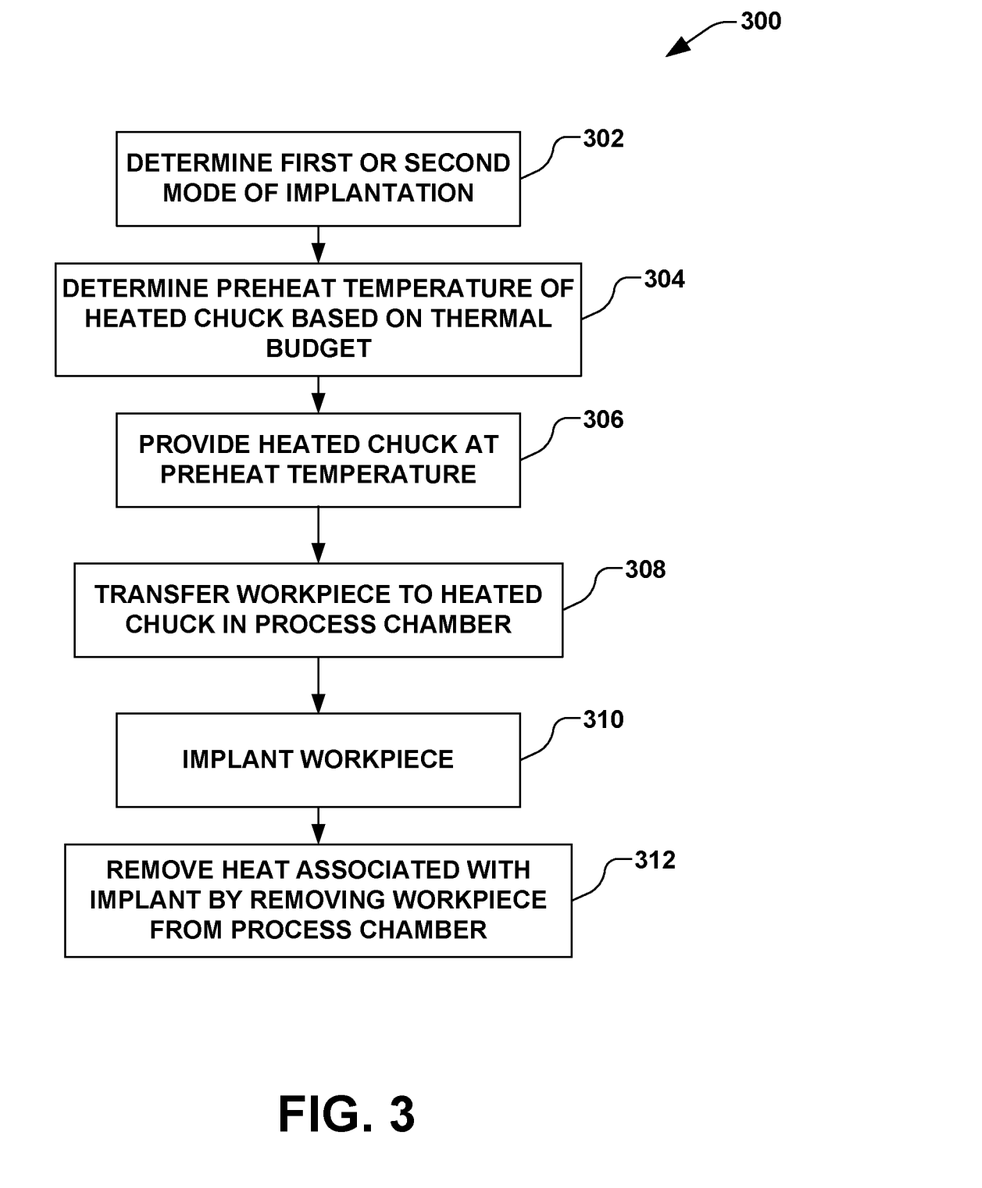
FIG. 3 is a block diagram illustrating an exemplary method for heated ion implantation of workpieces according to another exemplary aspect of the invention.

In another aspect of the disclosure, FIG. 3 illustrates another method 300 for processing workpieces. As illustrated in FIG. 3, an ion implantation system is configured to operate in each of a first implantation mode and a second implantation mode in act 302. In act 304, a preheat temperature of a heated chuck is determined based on the mode of operation of the ion implantation system and a thermal budget associated with the respective implantation mode. The heated chuck is further heated to the preheat temperature in act 306. In act 308, a workpiece is transferred onto the heated chuck in a process chamber and heated to the preheat temperature.

In act 310, the workpiece is implanted according to a process recipe in the respective first implantation mode or second implantation mode. In act 312, the workpiece is removed from the heated chuck and further removed from the process chamber, whereby the workpiece further removes the heat associated with the ion implantation therefrom.

Figure 4:
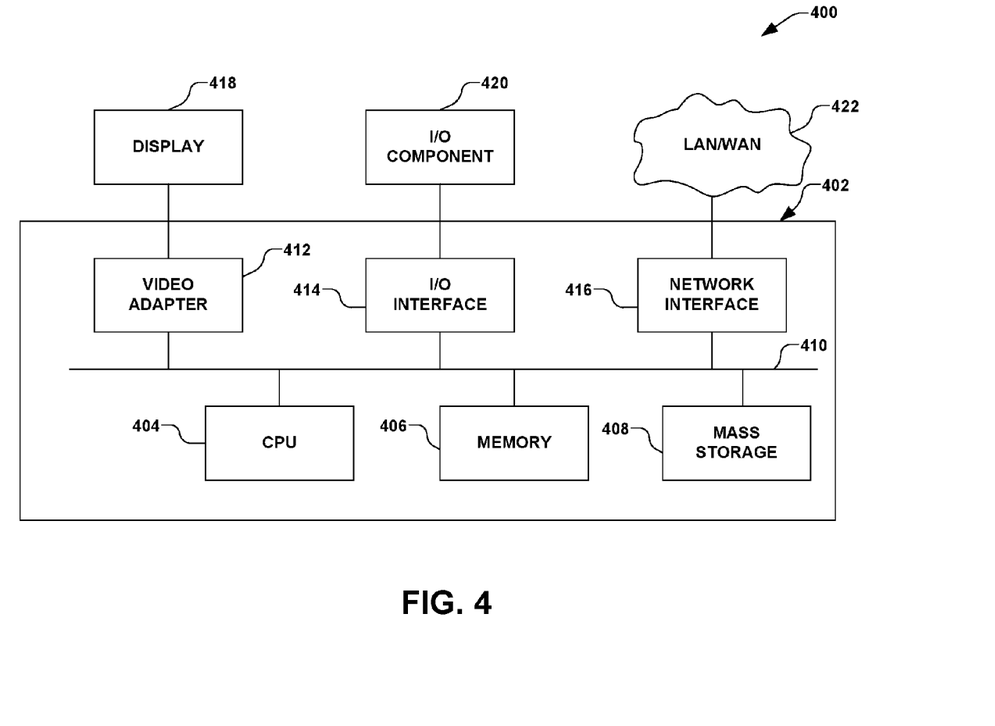
FIG. 4 is a block diagram illustrating an exemplary control system in accordance with another aspect.

In accordance with another aspect, the aforementioned methodology may be implemented using computer program code in one or more of a controller, general purpose computer, or processor based system. As illustrated in FIG. 4, a block diagram is provided of a processor based system 400 in accordance with another embodiment. The processor based system 400 is a general purpose computer platform and may be used to implement processes discussed herein. The processor based system 400 may include a processing unit 402, such as a desktop computer, a workstation, a laptop computer, or a dedicated unit customized for a particular application. The processor based system 400 may be equipped with a display 418 and one or more input/output devices 420, such as a mouse, a keyboard, or printer. The processing unit 402 may include a central processing unit (CPU) 404, memory 406, a mass storage device 408, a video adapter 412, and an I/O interface 414 connected to a bus 410.

The bus 410 may be one or more of any type of several bus architectures including a memory bus or memory controller, a peripheral bus, or video bus. The CPU 404 may include any type of electronic data processor, and the memory 406 may include any type of system memory, such as static random access memory (SRAM), dynamic random access memory (DRAM), or read-only memory (ROM).

The mass storage device 408 may include any type of storage device configured to store data, programs, and other information and to make the data, programs, and other information accessible via the bus 410. The mass storage device 408 may include, for example, one or more of a hard disk drive, a magnetic disk drive, or an optical disk drive.

The video adapter 412 and the I/O interface 414 provide interfaces to couple external input and output devices to the processing unit 402. Examples of input and output devices include the display 418 coupled to the video adapter 412 and the I/O device 420, such as a mouse, keyboard, printer, and the like, coupled to the I/O interface 414. Other devices may be coupled to the processing unit 402, and additional or fewer interface cards may be utilized. For example, a serial interface card (not shown) may be used to provide a serial interface for a printer. The processing unit 402 also may include a network interface 416 that may be a wired link to a local area network (LAN) or a wide area network (WAN) 422 and/or a wireless link.

It should be noted that the processor based system 400 may include other components. For example, the processor based system 400 may include power supplies, cables, a motherboard, removable storage media, cases, and the like. These other components, although not shown, are considered part of the processor based system 400.

Embodiments of the present disclosure may be implemented on the processor based system 400, such as by program code executed by the CPU 404. Various methods according to the above-described embodiments may be implemented by program code. Accordingly, explicit discussion herein is omitted.

Further, it should be noted that various modules and devices in FIG. 1 may be implemented on and controlled by one or more processor based systems 400 of FIG. 4. Communication between the different modules and devices may vary depending upon how the modules are implemented. If the modules are implemented on one processor based system 400, data may be saved in memory 406 or mass storage 408 between the execution of program code for different steps by the CPU 404. The data may then be provided by the CPU 404 accessing the memory 406 or mass storage 408 via bus 410 during the execution of a respective step. If modules are implemented on different processor based systems 400 or if data is to be provided from another storage system, such as a separate database, data can be provided between the systems 400 through I/O interface 414 or network interface 416. Similarly, data provided by the devices or stages may be input into one or more processor based systems 400 by the I/O interface 414 or network interface 416. A person having ordinary skill in the art will readily understand other variations and modifications in implementing systems and methods that are contemplated within the scope of varying embodiments.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system, comprising:
an ion implantation apparatus configured to direct an ion beam toward a process chamber;
a first chamber operably coupled to the process chamber;
a heated chuck positioned within the process chamber, wherein the heated chuck is configured to selectively clamp a workpiece to a clamping surface thereof;
a heating apparatus configured to selectively heat the clamping surface of the heated chuck;
a workpiece transfer apparatus configured to transfer the workpiece between the heated chuck and the first chamber; and
a controller configured to selectively transfer the workpiece between the heated chuck and the first chamber via the workpiece transfer apparatus, and wherein the controller is configured to selectively energize the heating apparatus to operate the heated chuck in each of a first mode and a second mode, wherein in the first mode, the heating apparatus heats the clamping surface to a first temperature, and wherein in the second mode, the heating apparatus heats the clamping surface to a second temperature, and wherein the first temperature is predetermined and associated with a high temperature ion implantation, and wherein the second temperature is associated with a quasi-room temperature ion implantation, wherein the controller is configured to determine the second temperature based on one or more of a thermal budget associated with the workpiece, an implant energy associated with the ion beam impacting the workpiece, and an initial temperature of the workpiece when the workpiece resides in the first chamber, wherein the controller is configured to generally maintain the second temperature on the heated chuck in the second mode, and wherein transferring the workpiece from the heated chuck to the first chamber generally removes the implant energy from the process chamber when the heated chuck is operated in the second mode, wherein the first temperature is greater than approximately 300° C. and wherein the second temperature is less than approximately 100° C.

2. The ion implantation system of claim 1, wherein the first temperature is approximately in the range of 300° C. to 600° C., and wherein the second temperature is approximately in the range of 20° C. to 100° C.

3. The ion implantation system of claim 1, wherein the heating apparatus heats comprises one or more heaters associated with the clamping surface of the heated chuck.

4. The ion implantation system of claim 3, wherein the one or more heaters comprise one or more resistive heaters embedded within the heated chuck.

5. The ion implantation system of claim 1, wherein the heating apparatus comprises a radiant heat source configured to selective heat the clamping surface of the heated chuck.

6. The ion implantation system of claim 5, wherein the radiant heat source comprises one or more of a halogen lamp, light emitting diode, and infrared thermal device.

7. The ion implantation system of claim 1, wherein the controller is configured to determine the second temperature based on all of the thermal budget associated with the workpiece, implant energy associated with the ion beam impacting the workpiece, and the initial temperature of the workpiece when the workpiece resides in the first chamber.

8. The ion implantation system of claim 1, further comprising a cooling platen configured to support and cool the workpiece.

9. The ion implantation system of claim 8, wherein the controller is further configured to transfer the workpiece between the heated chuck and the cooling platen without implanting ions into the workpiece via a control of the workpiece transfer apparatus, whereby the workpiece transfers heat from the heated chuck to the cooling platen, thereby cooling the heated chuck to a cool temperature associated with the second temperature.

10. A method for maintaining temperature consistency in an ion implantation system, the method comprising:
determining an operation of a heated chuck as being in one of a first mode and a second mode, wherein the first mode is associated with a high temperature ion implantation into a workpiece at a first temperature, wherein the first temperature is predetermined, and wherein the second mode is associated with a quasi-room temperature ion implantation into the workpiece at a second temperature;
determining the second temperature based on one or more of a thermal budget associated with the workpiece, an implant energy associated an the ion beam impacting the workpiece, and an initial temperature of the workpiece when the workpiece resides in a first chamber;
heating the heated chuck to the first temperature when the ion implantation system is in the first mode;
heating the heated chuck to the second temperature when the operation of the ion implantation system is in the second mode;
transferring the workpiece from the first chamber to the heated chuck;
implanting ions into the workpiece on the heated chuck; and
transferring the workpiece from the heated chuck to the first chamber, therein generally removing implant energy associated with the implantation of ions into the workpiece from the heated chuck when the heated chuck is operated in the second mode, wherein the first temperature is greater than approximately 300° C. and wherein the second temperature is less than approximately 100° C.

11. The method of claim 10, further comprising:
operating the heated chuck in the first mode; and
changing the operation of the heated chuck from the first mode to the second mode, wherein changing the operation of the heated chuck from the first mode to the second mode further comprises:
providing a cooling platen at a cool temperature associated with the second temperature; and
cycling one or more workpieces between the heated chuck and the cooling platen without implanting ions into the one or more workpieces, whereby the one or more workpieces transfer heat from the heated chuck to the cooling platen, thereby cooling the heated chuck.

12. The method of claim 10, wherein heating the heated chuck comprises selectively energizing one or more heaters embedded within the heated chuck.

13. The method of claim 10, wherein heating the heated chuck comprises radiantly heating a clamping surface of the heated chuck.

14. The method of claim 13, wherein radiantly heating the clamping surface of the heated chuck comprises directing one or more of a halogen lamp, light emitting diode, and infrared thermal device toward a clamping surface.

15. An ion implantation system, comprising:
an ion implantation apparatus configured to direct an ion beam toward a process chamber;
a first chamber operably coupled to the process chamber;
a heated chuck positioned within the process chamber, wherein the heated chuck is configured to selectively clamp a workpiece to a clamping surface thereof, wherein the heated chuck comprises a heating apparatus configured to selectively heat the clamping surface of the heated chuck;
a workpiece transfer apparatus configured to transfer the workpiece between the heated chuck and the first chamber; and
a controller configured to selectively transfer the workpiece between the heated chuck and the first chamber via the workpiece transfer apparatus, and wherein the controller is configured to selectively energize the heating apparatus to operate the heated chuck in each of a first mode and a second mode, wherein in the first mode, the heating apparatus heats the clamping surface to a first temperature, and wherein in the second mode, the heating apparatus heats the clamping surface to a second temperature, and wherein the first temperature is predetermined and associated with a high temperature ion implantation, and wherein the second temperature is associated with a quasi-room temperature ion implantation, wherein the controller is configured to determine the second temperature based on a thermal budget associated with the workpiece, an implant energy associated with the ion beam impacting the workpiece, and an initial temperature of the workpiece when the workpiece resides in the first chamber, wherein the controller is configured to generally maintain the second temperature on the heated chuck in the second mode, and wherein transferring the workpiece from the heated chuck to the first chamber generally removes the implant energy from the process chamber when the heated chuck is operated in the second mode, wherein the first temperature is greater than approximately 300° C. and wherein the second temperature is less than approximately 100° C.

16. The ion implantation system of claim 15, wherein the first temperature is approximately in the range of 300° C. to 600° C., and wherein the second temperature is approximately in the range of 20° C. to 100° C.

17. The ion implantation system of claim 15, wherein the heating apparatus comprises one or more resistive heaters embedded within the heated chuck and associated with the clamping surface of the heated chuck.

18. The ion implantation system of claim 15, further comprising a cooling platen configured to support and cool the workpiece.

19. The ion implantation system of claim 18, wherein the controller is further configured to transfer the workpiece between the heated chuck and the cooling platen without implanting ions into the workpiece via a control of the workpiece transfer apparatus, whereby the workpiece transfers heat from the heated chuck to the cooling platen, thereby cooling the heated chuck to a cool temperature associated with the second temperature.

* * * * *